(12) United States Patent
Tascione et al.

(10) Patent No.: US 10,885,240 B2
(45) Date of Patent: Jan. 5, 2021

(54) DETERMINISTIC SIMULATION FRAMEWORK FOR AUTONOMOUS VEHICLE TESTING

(71) Applicant: UATC, LLC, San Francisco, CA (US)

(72) Inventors: Daniel Joseph Tascione, Monroeville, PA (US); Jordan Peter Brindza, Pittsburgh, PA (US); Dillon Collins, Pittsburgh, PA (US)

(73) Assignee: UATC, LLC, San Francisco, CA (US)

( * ) Notice: Subject to any disclaimer, the term of this patent is extended or adjusted under 35 U.S.C. 154(b) by 464 days.

(21) Appl. No.: 15/834,691

(22) Filed: Dec. 7, 2017

(65) Prior Publication Data

US 2019/0130056 A1 May 2, 2019

Related U.S. Application Data

(60) Provisional application No. 62/580,703, filed on Nov. 2, 2017.

(51) Int. Cl.
*G06F 30/00* (2020.01)
*G06F 30/20* (2020.01)
*G05D 1/00* (2006.01)
*G05D 1/02* (2020.01)
*G06F 30/15* (2020.01)

(52) U.S. Cl.
CPC ........... *G06F 30/20* (2020.01); *G05D 1/0088* (2013.01); *G05D 1/0212* (2013.01); *G06F 30/15* (2020.01); *G05D 2201/0213* (2013.01)

(58) Field of Classification Search
CPC ...................................................... G06F 30/20
See application file for complete search history.

(56) References Cited

U.S. PATENT DOCUMENTS

| | | | | |
|---|---|---|---|---|
| 10,466,694 B1* | 11/2019 | Fairfield | ............... | G05D 1/0016 |
| 10,649,710 B2* | 5/2020 | Capt | ......................... | G09F 9/33 |
| 2006/0200333 A1* | 9/2006 | Dalal | ...................... | G06N 7/005 |
| | | | | 703/17 |
| 2014/0195213 A1* | 7/2014 | Kozloski | .................. | H04W 4/70 |
| | | | | 703/8 |
| 2015/0248131 A1* | 9/2015 | Fairfield | ............... | G05D 1/0038 |
| | | | | 701/2 |
| 2016/0210383 A1* | 7/2016 | Alaniz | ..................... | G06F 30/20 |
| 2016/0314224 A1* | 10/2016 | Wei | ......................... | G06F 30/20 |

(Continued)

*Primary Examiner* — Truc M Do
(74) *Attorney, Agent, or Firm* — Dority & Manning, P.A.

(57) ABSTRACT

Systems and methods for implementing deterministic simulation for autonomous vehicle testing can include an autonomy bookkeeper system configured to generate data logs that include inputs and outputs for each of a first plurality of tasks associated with an autonomy stack. The data logs can be generated upon detection of events such as failed implementation of an autonomy stack. A simulation conductor system can be configured to access the data logs as part of implementing offline testing of an autonomy testing scenario including a second plurality of tasks. A task controller within the simulation conductor system can schedule the second plurality of tasks into a task order determined at least in part from the first plurality of tasks (e.g., based on bookmarks stored in the data logs obtained during implementation of the first plurality of tasks). The flow of inputs to and outputs from the second plurality of tasks can be based at least in part on the task order.

19 Claims, 7 Drawing Sheets

(56) References Cited

U.S. PATENT DOCUMENTS

| | | | | |
|---|---|---|---|---|
| 2016/0334230 A1* | 11/2016 | Ross | ............... | G01C 21/3415 |
| 2016/0370801 A1* | 12/2016 | Fairfield | ............. | G05D 1/0038 |
| 2017/0103147 A1* | 4/2017 | Khanna | ............... | G06F 30/20 |
| 2017/0132334 A1* | 5/2017 | Levinson | ............. | G06F 30/20 |
| 2017/0286570 A1* | 10/2017 | Kim | ............... | G06F 30/20 |
| 2017/0357263 A1* | 12/2017 | Glatfelter | ............. | F42B 39/24 |
| 2019/0019349 A1* | 1/2019 | Dolgov | ............... | B60W 30/00 |

* cited by examiner

DETERMINISTIC SIMULATION FRAMEWORK FOR AUTONOMOUS VEHICLE TESTING

PRIORITY CLAIM

The present application is based on and claims priority to U.S. Provisional Application 62/580,703 having a filing date of Nov. 2, 2017, which is incorporated by reference herein.

FIELD

The present disclosure relates generally to features for improving autonomous vehicle testing and evaluation, and more particularly, to system and methods of implementing a deterministic simulation framework for autonomous vehicle testing.

BACKGROUND

An autonomous vehicle is a vehicle that is capable of sensing its environment and navigating without human input. In particular, an autonomous vehicle can observe its surrounding environment using a variety of sensors and can attempt to comprehend the environment by performing various processing techniques on data collected by the sensors. Given knowledge of its surrounding environment, the autonomous vehicle can identify an appropriate motion path through such surrounding environment.

Thus, a key objective associated with an autonomous vehicle is the ability to perceive objects (e.g., vehicles, pedestrians, cyclists) that are proximate to the autonomous vehicle and, further, to determine classifications of such objects as well as their locations. The ability to accurately and precisely detect and characterize objects of interest is fundamental to enabling the autonomous vehicle to generate an appropriate motion plan through its surrounding environment.

SUMMARY

Aspects and advantages of embodiments of the present disclosure will be set forth in part in the following description, or can be learned from the description, or can be learned through practice of the embodiments.

One example aspect of the present disclosure is directed to a simulation system for autonomous vehicle testing. The simulation system includes a memory configured to store data logs including a plurality of sets of one or more inputs and one or more outputs for each of a respective first plurality of tasks within an autonomy stack. The data logs further include bookmarks for the respective first plurality of tasks descriptive of a task ordering within the autonomy stack. The simulation system also includes one or more simulation computing devices including one or more processors and one or more tangible, non-transitory, computer readable media that collectively store instructions that when executed by the one or more processors cause the one or more simulation computing devices to perform operations. The operations include determining an autonomy scenario for testing, the autonomy scenario for testing including a second plurality of tasks. The operations also include scheduling the second plurality of tasks into a task order determined at least in part from the bookmarks stored in the data logs for the first plurality of tasks. The operations also include controlling the flow of inputs to and outputs from the second plurality of tasks based at least in part on the task order, wherein one or more inputs to the second plurality of tasks correspond to one or more inputs or outputs obtained from the data logs.

Another example aspect of the present disclosure is directed to a computer-implemented method. The method includes accessing, by a computing system including one or more computing devices, data logs associated with an event that occurred during implementation of an operational autonomy stack within a vehicle autonomy system. The data logs include a plurality of sets of one or more inputs and one or more outputs for each of a respective first plurality of tasks within the operational autonomy stack implemented by the vehicle autonomy system. The data logs further include bookmarks for the respective first plurality of tasks descriptive of a task ordering within the operational autonomy stack. The method also includes determining, by the computing system, an autonomy scenario for testing. The autonomy scenario for testing associated with a simulated autonomy stack includes a second plurality of tasks, wherein the second plurality of tasks is associated with at least a subset of the first plurality of tasks. The method also includes scheduling, by the computing system, the second plurality of tasks into a task order determined at least in part from the bookmarks. The method also includes controlling, by the computing system, the flow of inputs to and outputs from the second plurality of tasks based at least in part on the task order, wherein one or more inputs to the second plurality of tasks correspond to one or more inputs or outputs obtained from the data logs.

Another example aspect of the present disclosure is directed to an autonomous vehicle. The autonomous vehicle includes a sensor system configured to gather sensor data indicative of a surrounding environment of an autonomous vehicle. The autonomous vehicle further includes a vehicle autonomy system including one or more computing devices configured to implement a plurality of tasks within one or more modules of an operational autonomy stack to detect objects of interest within the sensor data and determine a motion plan for the autonomous vehicle relative to the objects of interest. The autonomous vehicle further includes a first memory configured to store inputs and outputs for each of the plurality of tasks within the operational autonomy stack. The autonomous vehicle further includes an event controller configured to detect one or more events associated with execution of at least a portion of the operational autonomy stack. The autonomous vehicle further includes a second memory configured to store data logs corresponding to the inputs and outputs for each task during a predetermined window of time corresponding to each event. The event controller is configured to transfer the inputs and outputs for each task during the predetermined window of time corresponding to each event from the first memory to the second memory upon detection of each event.

Other aspects of the present disclosure are directed to various methods, systems, apparatuses, vehicles, non-transitory computer-readable media, computer program products, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

DETAILED DESCRIPTION

Figure 1:
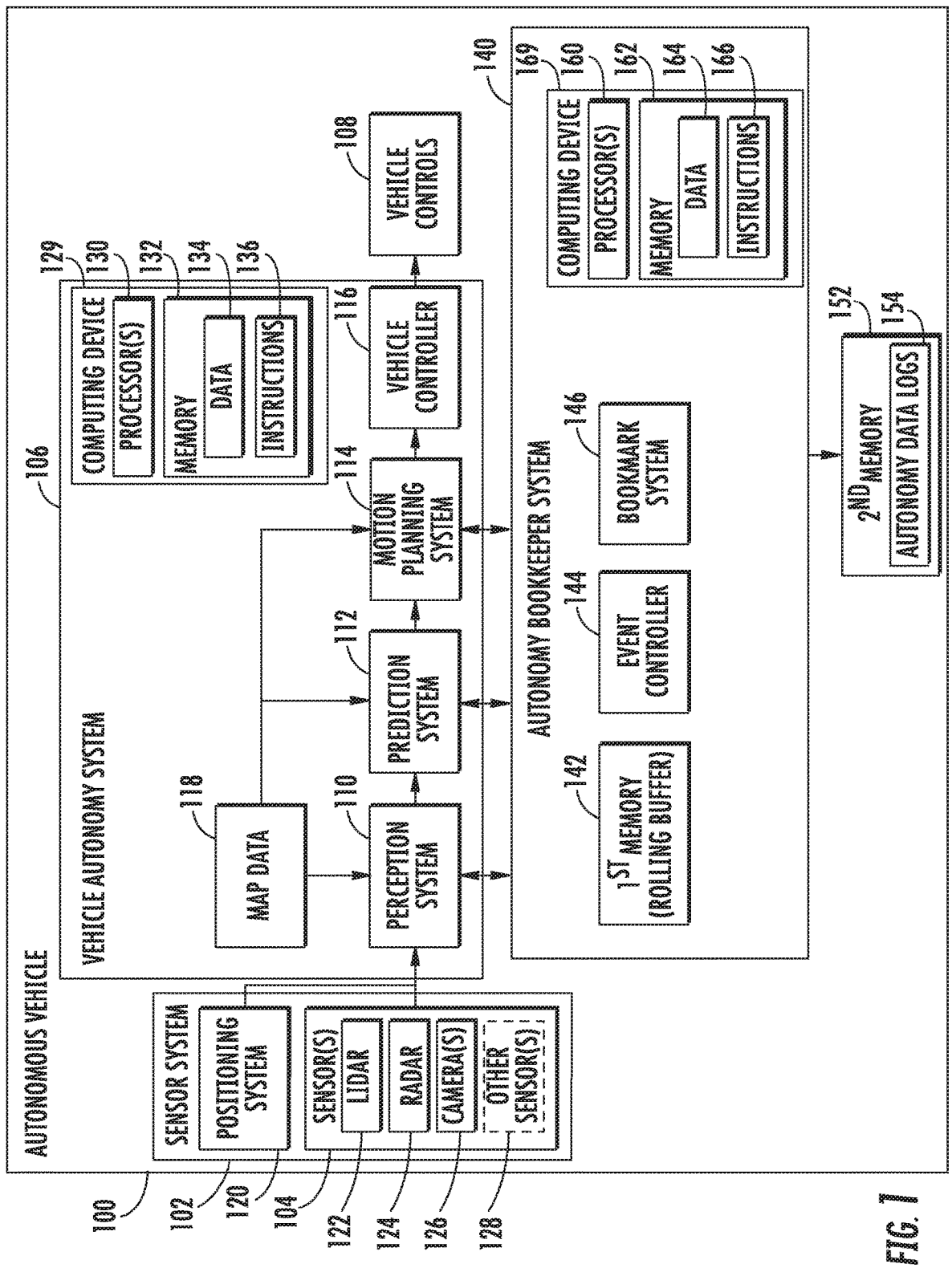
FIG. 1 depicts an example autonomous vehicle computing system according to example embodiments of the present disclosure.

Reference now will be made in detail to embodiments, one or more example(s) of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to improved systems and methods for implementing deterministic simulation for autonomous vehicle testing. An autonomous vehicle is capable of sensing its environment and navigating with little to no human input by dynamically determining an appropriate motion path relative to detected objects in the environment. More particularly, an autonomy bookkeeper system can generate data logs that include inputs and outputs for each of a first plurality of tasks associated with an autonomy stack (e.g., an operational autonomy stack or a simulated autonomy stack). In some implementations, the data logs are generated upon detection of events such as failed implementation of an autonomy stack. A simulation conductor system can be configured to access the data logs as part of implementing offline testing of an autonomy testing scenario including a second plurality of tasks. A task controller within the simulation conductor system can schedule the second plurality of tasks into a task order determined at least in part from the first plurality of tasks. For example, the task controller can determine the task order for the second plurality of tasks based on bookmarks stored in the data logs obtained during implementation of the first plurality of tasks. The flow of inputs to and outputs from the second plurality of tasks can be based at least in part on the task order. As such, a comprehensive and customizable framework is provided for deterministically testing autonomy system performance.

More particularly, according to one aspect of the present disclosure, an autonomous vehicle can include a sensor system, a vehicle autonomy system, an autonomy bookkeeper system, and a memory for storing autonomy data logs generated by the autonomy bookkeeper system. The memory devices can respectively correspond to one or more portions of non-transitory computer-readable media.

In some implementations, the sensor system can include one or more sensors, including but not limited to position sensors, cameras, LIDAR systems, RADAR systems, and other sensors. The sensor system can be configured to gather sensor data indicative of a surrounding environment of the autonomous vehicle.

In some implementations, the vehicle autonomy system can include one or more computing devices configured to implement a plurality of tasks within one or more modules of an operational autonomy stack to detect objects of interest within the sensor data and determine a motion plan for the autonomous vehicle relative to the objects of interest. The one or more modules of an operational autonomy stack can correspond, for example, to a perception system, a prediction system, a motion planning system, and a vehicle controller that cooperate to perceive the surrounding environment of the autonomous vehicle and determine a motion plan for controlling the motion of the autonomous vehicle accordingly.

In some implementations, the autonomy bookkeeper system can include a first memory, an event controller, and a bookmark system. The autonomy bookkeeper system can also include or otherwise be communicatively coupled to a second memory.

The first memory can correspond to a temporary storage location (e.g., a rolling buffer) configured to store inputs and outputs for each of a plurality of tasks within the operational autonomy stack implemented by the vehicle autonomy system. In some implementations, the inputs and outputs for each of a plurality of tasks can correspond to inputs and outputs between the sensor system and one or more modules of the vehicle autonomy system (e.g., a perception system, prediction system, motion planning system, and/or vehicle controller). In some implementations, the inputs and outputs for each of a plurality of tasks can correspond to inputs and outputs between different modules of the vehicle autonomy system. In some implementations, the inputs and outputs for each of a plurality of tasks can correspond to inputs and outputs between modules of the vehicle autonomy system and the autonomy bookkeeper system.

The event controller can be configured to detect one or more events associated with execution of at least a portion of the operational autonomy stack. Events detected by the event controller can include, but are not limited to, events associated with failed implementation of at least a portion of the operational autonomy stack, events in which the operational autonomy stack is manually disengaged by a vehicle operator, events in which the operational autonomy stack is automatically disengaged by the vehicle autonomy system, and events in which a vehicle fault occurs (e.g., a sensor fails, a task crashes, etc.).

The second memory associated with the autonomy bookkeeper system can correspond to a permanent storage location configured to store autonomy data logs including the inputs and outputs for each task implemented within the operational autonomy stack during a predetermined window of time corresponding to each event detected by the event controller. More particularly, the event controller is configured to transfer the inputs and outputs for each task during the predetermined window of time corresponding to each event from the first memory to the second memory upon detection of each event. In some implementations, the predetermined window of time includes a log start time and a log stop time respectively defined relative to an event time associated with each event. For instance, the log start time could be a number of seconds (x) before an event time (y) and the log stop time could be a number of seconds (z) after the event time.

More particularly, in some implementations, the event controller can be further configured to determine an event type associated with each event detected during implementation of the operational autonomy stack. In some implementations, the event type can be associated with a module of the one or more modules of the operational autonomy stack. For example, if an event happened because a task crashed within the prediction module of the operational autonomy stack, then the event type can be associated with the prediction system. When the event controller is configured to determine an event type for each detected event, the second memory can be further configured to store the event type in the autonomy data logs.

More particularly, in some implementations, the bookmark system can be configured to determine bookmarks for each task or group of tasks during the predetermined window of time corresponding to each event detected by the event controller. The bookmarks can be descriptive of a task ordering within the operational autonomy stack (e.g., a task ordering associated with a first plurality of tasks associated with the operational autonomy stack). In some implementations, the bookmarks can include one or more timestamps associated with the receipt of inputs for each task, one or more timestamps associated with the receipt of outputs for each task, an identification of one or more channels subscribing to the inputs and/or outputs associated with each task, a sequence of inputs, outputs and/or tasks associated with the operational autonomy stack, other suitable parameters, and combinations of these and other parameters. The second memory configured to store the autonomy data logs can be further configured to store the bookmarks determined by the bookmark system.

Generation of the disclosed autonomy data logs by an autonomy bookkeeper system can be advantageous in order to provide real-life data for testing subsequent changes to autonomy system tasks or other system features to ensure that an event is not repeated in the future. For example, an entity associated with an autonomous vehicle (e.g., a vehicle owner, a service provider, a fleet manager, etc.) may like to test modifications to an autonomy stack that were created in response to one or more events detected by the event controller. In order to test the modifications to the autonomy stack, the disclosed autonomy data logs can help deterministically recreate a simulated autonomy stack having deterministically scheduled inputs and outputs from the data logs. As such, modifications to the autonomy stack can be characterized appropriately, and successful modifications can be used to replace tasks within an original autonomy stack with newly modified and verified tasks from a simulated autonomy stack.

More particularly, according to another aspect of the present disclosure, a simulation system can include one or more computing devices configured to implement a plurality of tasks within one or more modules of a simulated autonomy stack. Similar to an operational autonomy stack, the one or more modules of a simulated autonomy stack can correspond, for example, to a perception system, a prediction system, a motion planning system, and a vehicle controller that cooperate to perceive the surrounding environment of the autonomous vehicle and determine a motion plan for controlling the motion of an autonomous vehicle accordingly. In some implementations, the simulation system can be implemented in an offline simulated environment. In other implementations, the simulation system can be implemented as part of deploying an autonomous vehicle on a test track.

According to another aspect of the present disclosure, a simulation conductor system can generally provide an interface between the simulation system and a memory storing autonomy data logs (e.g., autonomy data logs generated by a bookkeeper system within a vehicle autonomy system). The simulation conductor system can manage playback of autonomy data logs based on the logged determinism bookmarks by providing an application programming interface (API) for serving data inputs/outputs to a second plurality of tasks in the correct order. The simulation conductor system can maintain a state machine based on the contents of the bookmarks to determine execution of one or more wait, read, and/or write calls for inputs/outputs from the data logs when implementing a next task in a determined task order. In some implementations, a simulation conductor system can include one or more of a scenario controller, a task controller, an amendment system, and a simulation characterization system.

More particularly, in some implementations, the simulation conductor system can access a memory storing autonomy data logs. The autonomy data logs can include a plurality of sets of one or more inputs and one or more outputs for each of a respective first plurality of tasks within an autonomy stack. The autonomy data logs can further include bookmarks for the respective first plurality of tasks descriptive of a task ordering within the autonomy stack. In some implementations, the data logs for the first plurality of tasks can be associated with an event detected in response to failed implementation of at least a portion of the operational autonomy stack. In such instances, the data logs can additionally or alternatively include an indication of an event type associated with the event.

More particularly, in some implementations, the scenario controller within the simulation conductor system can determine an autonomy scenario for testing (e.g., a second plurality of tasks associated with a simulated autonomy stack). In some implementations, a second plurality of tasks associated with a simulated autonomy stack are substantially the same as a first plurality of tasks associated with an operational autonomy stack (e.g., an autonomy stack that had been previously implemented online during operation of an autonomous vehicle) to test repeatability of the simulated autonomy stack.

In some implementations, a second plurality of tasks associated with a simulated autonomy stack is modified relative to a corresponding first plurality of tasks associated with an operational autonomy stack. By providing at least one modification in the second plurality of tasks relative to the first plurality of tasks, the effects of the at least one modification can be tested relative to an event detected during implementation of the first plurality of tasks. For example, the simulation system may like to ensure that a potentially harmful event is resolved (e.g., the event does not occur during implementation of the second plurality of tasks) or that a safety case is maintained. Modification of tasks and/or modification of inputs and/or outputs from autonomy data logs can be implemented by an amendment system within the simulator conductor system.

More particularly, in some implementations, the task scheduler within the simulation conductor system can schedule the second plurality of tasks into a task order determined at least in part from the bookmarks stored in the data logs for the first plurality of tasks. In addition, the task scheduler can additionally control the flow of inputs to and outputs from the second plurality of tasks based at least in part on the task order, wherein one or more inputs to the second plurality of tasks correspond to one or more inputs or outputs obtained from the data logs. In some implementations, controlling the flow of inputs to and outputs from the second plurality of tasks based at least in part on the task order can include determining latencies for the inputs to each task to better simulate real-world timing as executed within a vehicle autonomy system. For instance, a second input timing associated with each task from the second plurality of tasks can be determined relative to a first input timing associated with each task from the first plurality of tasks, wherein the second input timing includes a determined latency relative to the first input timing.

More particularly, in some implementations, the simulation conductor system can determine a first task for execution within the second plurality of tasks based at least in part on an event type stored within the data logs, wherein the first task for execution within the second plurality of tasks corresponds to a corresponding task within the first plurality of tasks. For example, if an event type identifies an event corresponding to task failure in the prediction system of an operational autonomy stack, then the first task for execution within the second plurality of tasks might correspond to a task within the prediction system of the simulated autonomy stack as opposed to an earlier task (e.g., one within the perception system of the simulated autonomy stack). A substantial amount of time and processing resources can be saved by only running the portion of a simulated autonomy stack needed to test whether a fault is corrected as opposed to running a full simulation based on the entire simulated autonomy stack. As such, a total run time of the second plurality of tasks can be reduced relative to the first plurality of tasks.

More particularly, in some implementations, the simulation conductor system can determine a set of one or more inputs from the data logs associated with the corresponding task from the first plurality of tasks that corresponds with the first task from the second plurality of tasks. In some implementations, the set of one or more inputs from the data logs can be modified or amended to create a different type of data log than might otherwise be available. This could provide an advantage of being able to test operational limits of one or more performance features of an autonomy stack. The original or modified set of one or more inputs from the data logs can then be provided as the one or more inputs to the first task for execution within the second plurality of tasks.

More particularly, in some implementations, the simulation conductor system can determine one or more sets of one or more inputs or outputs from the data logs to provide as inputs or outputs to the second plurality of tasks for execution by one or more simulation computing devices. In some implementations, the simulation conductor system can support dynamic updating and scheduling of certain inputs and/or outputs from the data logs in a repeatable manner when certain tasks within the second plurality of tasks have circular dependencies on either inputs/outputs from the data logs or inputs/outputs from tasks within the second plurality of tasks. Additionally or alternatively, the simulation conductor system can allow sharing of resources from the data logs for inputs/outputs associated with data that is used across multiple different modules within an autonomy system (e.g., map data, sensor data, etc.) The simulation conductor system can advantageously accommodate centralized disk access for data log reading and/or writing to reduce load on network(s) sharing access to the disclosed features.

In some implementations, the simulation characterization system of the simulator conductor system can characterize execution of the second plurality of tasks from the simulated autonomy stack. More particularly, the simulation characterization system can compare a set of one or more outputs of the simulated autonomy stack after implementation of at least the first task from the second plurality of tasks with a corresponding set of one or more outputs from the data logs corresponding to the output of the operational autonomy stack after implementation of at least the corresponding task from the first plurality of tasks. A simulation characterization can be determined based at least in part on the comparison of the set of one or more outputs of the simulated autonomy stack with the corresponding set of one or more outputs from the data logs. For example, the simulation characterization can include a characterization of the simulation as either successful (e.g., by avoiding occurrence of the event detected during implementation of the first plurality of tasks) or unsuccessful (e.g., by repeating occurrence of the event detected during implementation of the first plurality of tasks). In some implementations, a portion of autonomy software (e.g., at least a portion of the first plurality of tasks from the operational autonomy stack) can be updated based at least in part on the simulation characterization. For instance, if the simulation is characterized as successful, then at least a portion of the first plurality of tasks from the operational autonomy stack can be replaced by at least a portion of the second plurality of tasks from the simulated autonomy stack.

In some implementations, the second plurality of tasks associated with the simulated autonomy stack can be implemented by multiple distinct processing threads within the one or more simulation computing devices. More particularly, each processing thread can be configured to implement tasks relative to one or more input channels and one or more output channels. In such implementations, the task controller within the simulation conductor system can schedule the second plurality of tasks into a task order and control the flow of inputs to and outputs from the second plurality of tasks for each of the one or more input channels and one or more output channels relative to each of the multiple distinct processing threads.

The systems and methods described herein provide a number of technical effects and benefits. For instance, the present disclosure provides systems and methods for improved testing of autonomous vehicles. More particularly, systems and methods for generating autonomy data logs by an autonomy bookkeeper system can help detect when certain potentially undesirable events occur within autonomous vehicle operation (e.g., an autonomous vehicle automatically disengages from an autonomous operating mode to a manual operating mode requiring physical intervention from a vehicle operator, an autonomous vehicle is controlled to perform a safe-stop action as opposed to proceeding with autonomous navigation, etc.). By detecting potentially undesirable events, improvements to the autonomy system can be identified and developed. Ideally, autonomy system features can be determined so that undesirable events are not repeated during future autonomy system execution.

The disclosed systems and methods can provide an additional technical effect and benefit of generating data logs that can deterministically reproduce real-life data for testing subsequent changes to autonomy system tasks or other system features. For example, inputs and/or outputs associated with a first plurality of tasks identified by the data logs can be provided to a second plurality of tasks within a simulated autonomy stack. In order to test changes to the autonomy system to see if a correction (e.g., a task modification addressing a detected event) is successful, there is a need to reproduce the data and timing associated with the event to make sure the same event doesn't happen again. Without the disclosed systems and methods for generating data logs, this can be extremely difficult due to the infrequent nature of certain events (e.g., once every million miles). Further, the systems and methods of the present disclosure can allow for events to be recreated, thereby avoiding costs and time associated with waiting for such events to occur on their own. Moreover, the systems and methods disclosed herein can allow for the exact conditions of an event to be replicated, which can help to ensure that any modifications to an autonomous vehicle address the conditions which caused the event. Thus, the disclosed systems and methods help provide deterministic playback of tasks offline to produce the same results as happened live during autonomous vehicle operation.

The disclosed systems and methods can provide an additional technical effect and benefit of providing a comprehensive and customizable framework for deterministically testing autonomy system performance. More particularly, an amendment system can be provided relative to generated autonomy vehicle logs such that inputs, outputs and/or tasks can be amended relative to detected and captured versions of such data. For example, in some implementations, one or more of a second plurality of tasks within a simulated autonomy stack can be modified relative to a first plurality of tasks from the data logs. In response, the disclosed simulation framework can help deterministically test modifications to autonomy software by obtaining repeatable and/or consistent results for understanding autonomy system performance. In other implementations, modifications can be made to the inputs and/or outputs stored in the autonomy data logs, thereby helping to develop many more autonomy testing scenarios than might otherwise be available in the actual log data. As such, the systems and methods provide a more efficient approach to autonomous vehicle software development and testing.

The systems and methods of the present disclosure also provide an improvement to the computational efficiency of a simulation computing system. More particularly, a first task within a second plurality of tasks for execution within a simulated autonomy stack can be determined such that a total run time for execution of the second plurality of tasks can be reduced relative to a total run time for execution of the first plurality of tasks. The first task can be identified, for example, based on an event type associated with the first plurality of tasks. For example, if an event type identifies an event corresponding to task failure in the prediction system of an operational autonomy stack, then the first task for execution within the second plurality of tasks might correspond to a task within the prediction system of the simulated autonomy stack as opposed to an earlier task (e.g., one within the perception system of the simulated autonomy stack). A substantial amount of time and processing resources can be saved by only running the portion of a simulated autonomy stack needed to test whether a fault is corrected as opposed to running a full simulation based on the entire simulated autonomy stack.

The systems and methods of the present disclosure also provide an improvement to vehicle computing technology, such as simulated autonomy computing technology. In particular, a computing system (e.g., simulation computing system) can access data logs associated with an event that occurred during implementation of an operational autonomy stack within a vehicle autonomy system. The data logs can include a plurality of sets of one or more inputs and one or more outputs for each of a respective first plurality of tasks within the operational autonomy stack implemented by the vehicle autonomy system. The data logs can also include bookmarks for the respective first plurality of tasks descriptive of a task ordering within the operational autonomy stack. The simulation computing system can also determine an autonomy scenario for testing. The autonomy scenario for testing can be associated with a simulated autonomy stack including a second plurality of tasks, wherein the second plurality of tasks is associated with at least a subset of the first plurality of tasks. The simulation computing system can also schedule the second plurality of tasks into a task order determined at least in part from the bookmarks stored in the data logs for the first plurality of tasks. The simulation computing system can also control the flow of inputs to and outputs from the second plurality of tasks based at least in part on the task order. As such, the testing of a simulated autonomy stack can be improved by providing a coordinated and deterministic framework for implementing simulation. Ultimately, the improved testing of the autonomous vehicle computing system as described herein can improve the ability of an autonomous vehicle to perceive its surrounding environment, predict object movement, plan vehicle motion, and safely navigate through the surrounding environment.

With reference now to the figures, example embodiments of the present disclosure will be discussed in further detail.

FIG. 1 depicts a block diagram of an example autonomous vehicle 100 according to example embodiments of the present disclosure. The autonomous vehicle 100 is capable of sensing its environment and navigating with little to no human input. The autonomous vehicle 100 can be a ground-based autonomous vehicle (e.g., car, truck, bus, etc.), an air-based autonomous vehicle (e.g., airplane, drone, helicopter, or other aircraft), or other types of vehicles (e.g., watercraft).

The autonomous vehicle 100 includes a sensor system 102, a vehicle autonomy system 106, one or more vehicle controls 108, an autonomy bookkeeper system 140, and a second memory 152 configured to store autonomy data logs 154. The vehicle autonomy system 106 can assist in controlling the autonomous vehicle 100. In particular, the vehicle autonomy system 106 can receive sensor data from the sensor system 102, attempt to comprehend the surrounding environment by performing various processing techniques on data collected by the sensors 104 within sensor system 102, and generate an appropriate motion path through such surrounding environment. The vehicle autonomy system 106 can control the one or more vehicle controls 108 to operate the autonomous vehicle 100 according to the motion path.

The vehicle autonomy system 106 includes one or more computing devices 129, each computing device 129 respectively including one or more processors 130 and a memory 132. The one or more processors 130 can be any suitable processing device (e.g., a processor core, a microprocessor, an ASIC, a FPGA, a CPU, a CPU, a controller, a microcontroller, etc.) and can be one processor or a plurality of processors that are operatively connected. The memory 132 can include one or more non-transitory computer-readable storage mediums, such as RAM, ROM, EEPROM, EPROM, flash memory devices, magnetic disks, etc., and combinations thereof. The memory 132 can store data 134 and instructions 136 which are executed by the one or more processors 130 to cause vehicle autonomy system 106 to perform operations.

As illustrated in FIG. 1, the vehicle autonomy system 106 can include one or more computing devices 129 configured to implement a plurality of tasks within one or more modules of an operational autonomy stack to detect objects of interest within the sensor data and determine a motion plan for the autonomous vehicle 100 relative to the objects of interest. The one or more modules of an operational autonomy stack can correspond, for example, to a perception system 110, a prediction system 112, a motion planning system 114, and a vehicle controller 116 that cooperate to perceive the surrounding environment of the autonomous vehicle and determine a motion plan for controlling the motion of the autonomous vehicle 100 accordingly.

In particular, in some implementations, the perception system 110 can receive sensor data from the one or more sensors 104 that are coupled to or otherwise included within the sensor system 102 of autonomous vehicle 100. As examples, the one or more sensors 104 can include a Light Detection and Ranging (LIDAR) system 122, a Radio Detection and Ranging (RADAR) system 124, one or more cameras (e.g., visible spectrum cameras, infrared cameras, etc.) 126, and/or other sensors 128. The sensor data can include information that describes the location of objects within the surrounding environment of the autonomous vehicle 100.

As one example, for a LIDAR system 122, the sensor data can include the location (e.g., in three-dimensional space relative to the LIDAR system 122) of a number of points that correspond to objects that have reflected a ranging laser. For example, LIDAR system 122 can measure distances by measuring the Time of Flight (TOF) that it takes a short laser pulse to travel from the sensor to an object and back, calculating the distance from the known speed of light.

As another example, for a RADAR system 124, the sensor data can include the location (e.g., in three-dimensional space relative to the RADAR system 124) of a number of points that correspond to objects that have reflected a ranging radio wave. For example, radio waves (e.g., pulsed or continuous) transmitted by the RADAR system 124 can reflect off an object and return to a receiver of the RADAR system 124, giving information about the object's location and speed. Thus, RADAR system 124 can provide useful information about the current speed of an object.

As yet another example, for one or more cameras 126, various processing techniques (e.g., range imaging techniques such as, for example, structure from motion, structured light, stereo triangulation, and/or other techniques) can be performed to identify the location (e.g., in three-dimensional space relative to the one or more cameras 126) of a number of points that correspond to objects that are depicted in imagery captured by the one or more cameras 126. Other sensor systems 128 can identify the location of points that correspond to objects as well.

As another example, the one or more sensors 104 can include a position sensor or positioning system 120. The positioning system 120 can determine a current position of the autonomous vehicle 100. The positioning system 120 can be any device or circuitry for analyzing the position of the autonomous vehicle 100. For example, the positioning system 120 can determine position by using one or more of inertial sensors, a satellite positioning system, based on IP address, by using triangulation and/or proximity to network access points or other network components (e.g., cellular towers, WiFi access points, etc.) and/or other suitable techniques. The position of the autonomous vehicle 100 can be used by various systems of the vehicle autonomy system 106.

In addition to the sensor data, the perception system 110 can retrieve or otherwise obtain map data 118 that provides detailed information about the surrounding environment of the autonomous vehicle 100. The map data 118 can provide information regarding: the identity and location of different travelways (e.g., roadways), road segments, buildings, or other items or objects (e.g., lampposts, crosswalks, curbing, etc.); the location and directions of traffic lanes (e.g., the location and direction of a parking lane, a turning lane, a bicycle lane, or other lanes within a particular roadway or other travelway); traffic control data (e.g., the location and instructions of signage, traffic lights, or other traffic control devices); and/or any other map data that provides information that assists the vehicle autonomy system 106 in comprehending and perceiving its surrounding environment and its relationship thereto.

The perception system 110 can identify one or more objects that are proximate to the autonomous vehicle 100 based on sensor data received from the one or more sensors 104 and/or the map data 118. In particular, in some implementations, the perception system 110 can determine, for each object, state data that describes a current state of such object. As examples, the state data for each object can describe an estimate of the object's: current location (also referred to as position); current speed (also referred to as velocity); current acceleration; current heading; current orientation; size/footprint (e.g., as represented by a bounding shape such as a bounding polygon or polyhedron); class (e.g., vehicle versus pedestrian versus bicycle versus other); yaw rate; and/or other state information.

In some implementations, the perception system 110 can determine state data for each object over a number of iterations. In particular, the perception system 110 can update the state data for each object at each iteration. Thus, the perception system 110 can detect and track objects (e.g., vehicles) that are proximate to the autonomous vehicle 100 over time.

The prediction system 112 can receive the state data from the perception system 110 and predict one or more future locations for each object based on such state data. For example, the prediction system 112 can predict where each object will be located within the next 5 seconds, 10 seconds, 20 seconds, etc. As one example, an object can be predicted to adhere to its current trajectory according to its current speed. As another example, other, more sophisticated prediction techniques or modeling can be used.

The motion planning system 114 can determine a motion plan for the autonomous vehicle 100 based at least in part on the predicted one or more future locations for the object and/or the state data for the object provided by the perception system 110. Stated differently, given information about the current locations of objects and/or predicted future locations of proximate objects, the motion planning system 114 can determine a motion plan for the autonomous vehicle 100 that best navigates the autonomous vehicle 100 relative to the objects at such locations.

In particular, according to an aspect of the present disclosure, the motion planning system 114 can evaluate one or more cost functions and/or one or more reward functions for each of one or more candidate motion plans for the autonomous vehicle 100. For example, the cost function(s) can describe a cost (e.g., over time) of adhering to a particular candidate motion plan while the reward function(s) can describe a reward for adhering to the particular candidate motion plan. For example, the reward can be of opposite sign to the cost.

Thus, given information about the current locations and/or predicted future locations of objects, the motion planning system 114 can determine a total cost (e.g., a sum of the cost(s) and/or reward(s) provided by the cost function(s) and/or reward function(s)) of adhering to a particular candidate pathway. The motion planning system 114 can select or determine a motion plan for the autonomous vehicle 100 based at least in part on the cost function(s) and the reward function(s). For example, the motion plan that minimizes the total cost can be selected or otherwise determined. The motion planning system 114 can provide the selected motion plan to a vehicle controller 116 that controls one or more vehicle controls 108 (e.g., actuators or other devices that control gas flow, steering, braking, etc.) to execute the selected motion plan.

Each of the perception system 110, the prediction system 112, the motion planning system 114, and the vehicle controller 116 can include computer logic utilized to provide desired functionality. In some implementations, each of the perception system 110, the prediction system 112, the motion planning system 114, and the vehicle controller 116 can be implemented in hardware, firmware, and/or software controlling a general purpose processor. For example, in some implementations, each of the perception system 110, the prediction system 112, the motion planning system 114, and the vehicle controller 116 includes program files stored on a storage device, loaded into a memory and executed by one or more processors. In other implementations, each of the perception system 110, the prediction system 112, the motion planning system 114, and the vehicle controller 116 includes one or more sets of computer-executable instructions that are stored in a tangible computer-readable storage medium such as RAM hard disk or optical or magnetic media.

Referring still to FIG. 1, autonomy bookkeeper system 140 can include a first memory 142, an event controller 144, and a bookmark system 146. The autonomy bookkeeper system 146 can also include or otherwise be communicatively coupled to a second memory 152 for storing autonomy data logs 154. In general, autonomy bookkeeper system 140 can generate autonomy data logs 154 that include inputs and outputs for each of a first plurality of tasks associated with an autonomy stack (e.g., a stack of tasks for execution by vehicle autonomy system 106). In some implementations, the autonomy data logs 154 are generated upon detection of events such as failed implementation of an autonomy stack. Autonomy data logs 154 are stored in one or more memory devices (e.g., second memory 152), corresponding to respective portions of non-transitory computer-readable media.

The first memory 142 can correspond to a temporary storage location (e.g., a rolling buffer) configured to store inputs and outputs for each of a plurality of tasks within the operational autonomy stack implemented by the vehicle autonomy system 106. In some implementations, the inputs and outputs for each of a plurality of tasks can correspond to inputs and outputs between the sensor system 102 and one or more modules of the vehicle autonomy system 106 (e.g., perception system 110, prediction system 112, motion planning system 114, and/or vehicle controller 116). In some implementations, the inputs and outputs for each of a plurality of tasks can correspond to inputs and outputs between different modules of the vehicle autonomy system 106. In some implementations, the inputs and outputs for each of a plurality of tasks can correspond to inputs and outputs between modules of the vehicle autonomy system 106 and the autonomy bookkeeper system 140.

The event controller 144 can be configured to detect one or more events associated with execution of at least a portion of the operational autonomy stack. Events detected by the event controller 144 can include, but are not limited to, events associated with failed implementation of at least a portion of the operational autonomy stack, events in which the operational autonomy stack is manually disengaged by a vehicle operator, events in which the operational autonomy stack is automatically disengaged by the vehicle autonomy system 106, and events in which a vehicle fault occurs (e.g., a sensor fails, a task crashes, etc.).

The second memory 152 associated with the autonomy bookkeeper system can correspond to a permanent storage location configured to store autonomy data logs 154 including the inputs and outputs for each task implemented within the operational autonomy stack during a predetermined window of time corresponding to each event detected by the event controller 144. More particularly, the event controller 144 is configured to transfer the inputs and outputs for each task during the predetermined window of time corresponding to each event from the first memory 142 to the second memory 152 upon detection of each event. In some implementations, the predetermined window of time includes a log start time and a log stop time respectively defined relative to an event time associated with each event. For instance, the log start time could be a number of seconds (x) before an event time (y) and the log stop time could be a number of seconds (z) after the event time (y).

More particularly, in some implementations, the event controller 144 can be further configured to determine an event type associated with each event detected during implementation of the operational autonomy stack. In some implementations, the event type can be associated with a module of the one or more modules of the vehicle autonomy system 106 (e.g., the perception system 110, prediction system 112, motion planning system 114, vehicle controller 116, etc.). For example, if an event happened because a task crashed within the prediction module 112 of the vehicle autonomy system 106, then the event type can be associated with the prediction system 112. When the event controller 144 is configured to determine an event type for each detected event, the second memory 152 can be further configured to store the event type in the autonomy data logs 154.

More particularly, in some implementations, the bookmark system 146 can be configured to determine bookmarks for each task or group of tasks during the predetermined window of time corresponding to each event detected by the event controller 144. The bookmarks can be descriptive of a task ordering within the operational autonomy stack (e.g., a task ordering associated with a first plurality of tasks associated with the operational autonomy stack for execution by vehicle autonomy system 106). In some implementations, the bookmarks generated by bookmark system 146 can include one or more timestamps associated with the receipt of inputs for each task, one or more timestamps associated with the receipt of outputs for each task, an identification of one or more channels subscribing to the inputs and/or outputs associated with each task, a sequence of inputs, outputs and/or tasks associated with the operational autonomy stack, other suitable parameters, and combinations of these and other parameters. The second memory 152 configured to store the autonomy data logs 154 can be further configured to store the bookmarks determined by the bookmark system 146.

Generation of the disclosed autonomy data logs 154 by an autonomy bookkeeper system 140 can be advantageous in order to provide real-life data for testing subsequent changes to tasks implemented by vehicle autonomy system 106 or other system features to ensure that an event is not repeated in the future. For example, an entity associated with autonomous vehicle 100 (e.g., a vehicle owner, a service provider, a fleet manager, etc.) may like to test modifications to an autonomy stack that were created in response to one or more events detected by the event controller 144. In order to test the modifications to the autonomy stack, the disclosed autonomy data logs 154 can help deterministically recreate a simulated autonomy stack having deterministically scheduled inputs and outputs from the data logs. As such, modifications to the autonomy stack can be characterized appropriately, and successful modifications can be used to replace tasks within an original autonomy stack with newly modified and verified tasks from a simulated autonomy stack.

Autonomy bookkeeper system 140 can include one or more computing devices 159, each computing device 159 respectively including one or more processors 160 and a memory 162. The one or more processors 160 can be any suitable processing device (e.g., a processor core, a microprocessor, an ASIC, a FPGA, a CPU, a GPU, a controller, a microcontroller, etc.) and can be one processor or a plurality of processors that are operatively connected. The memory 162 can include one or more non-transitory computer-readable storage mediums, such as RAM, ROM, EEPROM, EPROM, flash memory devices, magnetic disks, etc., and combinations thereof. The memory 162 can store data 164 and instructions 166 which are executed by the one or more processors 160 to cause autonomy bookkeeper system 146 to perform operations.

Figure 2:
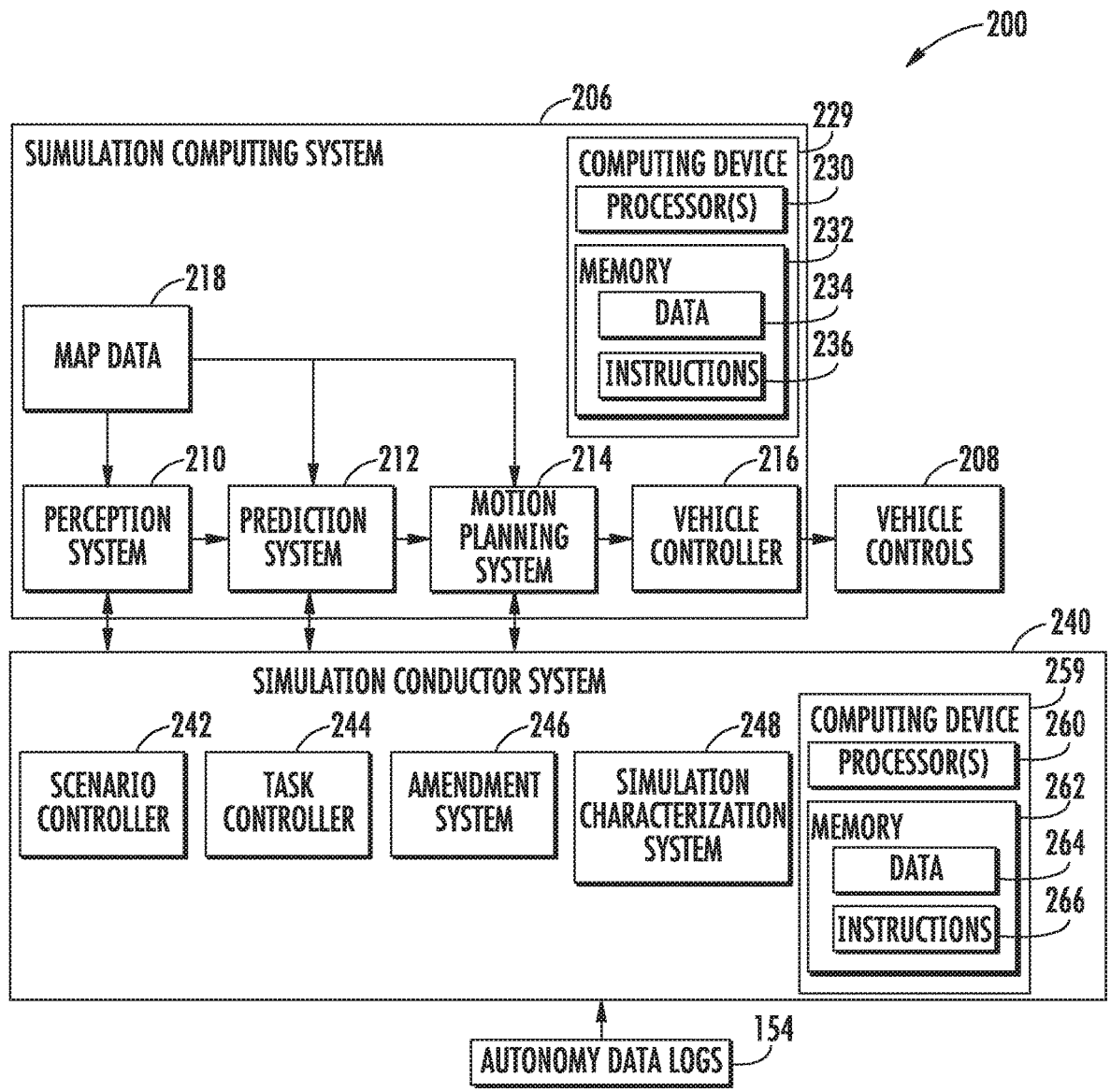
FIG. 2 depicts an example simulation computing system according to example embodiments of the present disclosure.

FIG. 2 depicts an example simulation system 200 for implementing a deterministic simulation framework for autonomous vehicle testing and evaluation. For example, simulation system 200 can implement testing and evaluation to help improve the operation of autonomy vehicle 100 of FIG. 1. In some implementations, simulation computing system 200 of FIG. 2 can be communicatively coupled via one or more networks to one or more computing systems (e.g., vehicle autonomy system 106 and/or autonomy bookkeeper system 140) of autonomous vehicle 100 of FIG. 1. In such instances, autonomous vehicle 100 and simulation system 200 can respectively include network interfaces used communicate with one or more systems or devices, including systems or devices that are remotely located. Such network interfaces can include any circuits, components, communications controllers, receivers, transceivers, transmitters, ports, conductors, software, and/or hardware for communicating data over a network. The network(s) can be any type of network or combination of networks that allows for communication between devices. In some embodiments, the network(s) can include one or more of a local area network, wide area network, the Internet, secure network, cellular network, mesh network, peer-to-peer communication link, and/or some combination thereof, and can include any number of wired or wireless links.

Simulation system 200 can include a simulation computing system 206 and a simulation conductor system 240. The simulation conductor system 240 can be configured to access the autonomy data logs 154 generated by autonomy bookkeeper system 140 of FIG. 1 as part of implementing offline testing of an autonomy testing scenario including a second plurality of tasks associated with a simulated autonomy stack for execution by simulation computing system 206.

More particularly, simulation computing system 206 can include one or more computing devices 229 configured to implement a plurality of tasks within one or more modules of a simulated autonomy stack for execution by simulation computing system 206. Similar to an operational autonomy stack (e.g., an operational autonomy stack for execution by vehicle autonomy system 106 of FIG. 1), the one or more modules of a simulated autonomy stack can correspond, for example, to a perception system 210, a prediction system 212, a motion planning system 214, and a vehicle controller 216. Such modules can cooperate to perceive the surrounding environment of an autonomous vehicle (e.g., autonomous vehicle 100 of FIG. 1 or a real or simulated test vehicle) and determine a motion plan for controlling the motion of the autonomous vehicle accordingly.

In some implementations, the simulation computing system 206 can be implemented in an offline simulated environment. In other implementations, the simulation computing system 206 can be implemented as part of deploying an autonomous vehicle on a test track. Vehicle controls 208, perception system 210, prediction system 212, motion planning system 214, vehicle controller 216, and map data 218 of simulation computing system 206 can include similar features as corresponding elements 108-118 within vehicle autonomy system 106 of FIG. 1, and corresponding description of such elements in FIG. 1 can be equally applicable where appropriate to the corresponding elements of FIG. 2.

The simulation computing system 206 includes one or more computing devices 229, each computing device 229 respectively including one or more processors 230 and a memory 232. The one or more processors 230 can be any suitable processing device (e.g., a processor core, a microprocessor, an ASIC, a FPGA, a CPU, a GPU, a controller, a microcontroller, etc.) and can be one processor or a plurality of processors that are operatively connected. The memory 232 can include one or more non-transitory computer-readable storage mediums, such as RAM, ROM, EEPROM, EPROM, flash memory devices, magnetic disks, etc., and combinations thereof. The memory 232 can store data 234 and instructions 236 which are executed by the one or more processors 230 to cause simulation computing system 206 to perform operations.

Simulation conductor system 240 can generally provide an interface between the simulation computing system 206 and a memory (e.g., second memory 152 of FIG. 1) storing autonomy data logs 154. The simulation conductor system 240 can manage playback of autonomy data logs 154 based on the logged determinism bookmarks by providing an application programming interface (API) for serving data inputs/outputs to a second plurality of tasks in the correct order. The simulation conductor system 240 can maintain a state machine based on the contents of the bookmarks to determine execution of one or more wait, read, and/or write calls for inputs/outputs from the autonomy data logs 154 when implementing a next task in a determined task order. In some implementations, simulation conductor system can include one or more of a scenario controller 242, a task controller 244, an amendment system 246, and a simulation characterization system 248.

More particularly, in some implementations, the scenario controller 242 within the simulation conductor system 240 can determine an autonomy scenario for testing (e.g., a second plurality of tasks associated with a simulated autonomy stack). In some implementations, a second plurality of tasks associated with a simulated autonomy stack for execution by simulation computing system 206 are substantially the same as a first plurality of tasks associated with an operational autonomy stack (e.g., an autonomy stack that had been previously implemented online by vehicle autonomy system 106 during operation of autonomous vehicle 100) to test repeatability of the simulated autonomy stack.

In some implementations, a second plurality of tasks associated with a simulated autonomy stack is modified relative to a corresponding first plurality of tasks associated with an operational autonomy stack. By providing at least one modification in the second plurality of tasks relative to the first plurality of tasks, the effects of the at least one modification can be tested relative to an event detected during implementation of the first plurality of tasks. For example, the simulation system 200 may like to ensure that a potentially harmful event is resolved (e.g., the event does not occur during implementation of the second plurality of tasks) or that a safety case is maintained. Modification of tasks and/or modification of inputs and/or outputs from autonomy data logs can be implemented by an amendment system 246 within the simulator conductor system 240.

More particularly, in some implementations, the task controller 244 within the simulation conductor system 240 can schedule the second plurality of tasks into a task order determined at least in part from the bookmarks stored in the autonomy data logs 154 for the first plurality of tasks. In addition, the task controller can additionally control the flow of inputs to and outputs from the second plurality of tasks based at least in part on the task order, wherein one or more inputs to the second plurality of tasks correspond to one or more inputs or outputs obtained from the autonomy data logs 154. In some implementations, controlling the flow of inputs to and outputs from the second plurality of tasks based at least in part on the task order can include determining latencies for the inputs to each task to better simulate real-world timing as executed within a vehicle autonomy system (e.g., vehicle autonomy system 106 of FIG. 1). For instance, a second input timing associated with each task from the second plurality of tasks can be determined relative to a first input timing associated with each task from the first plurality of tasks, wherein the second input timing includes a determined latency relative to the first input timing.

More particularly, in some implementations, the simulation conductor system 240 can determine a first task for execution within the second plurality of tasks based at least in part on an event type stored within the autonomy data logs 154, wherein the first task for execution within the second plurality of tasks corresponds to a corresponding task within the first plurality of tasks. For example, if an event type identifies an event corresponding to task failure in the prediction system 112 of an operational autonomy stack, then the first task for execution within the second plurality of tasks might correspond to a task within the prediction system 212 of the simulated autonomy stack as opposed to an earlier task (e.g., one within the perception system 210 of the simulated autonomy stack). A substantial amount of time and processing resources can be saved by only running the portion of a simulated autonomy stack needed to test whether a fault is corrected as opposed to running a full simulation based on the entire simulated autonomy stack. As such, a total run time of the second plurality of tasks can be reduced relative to the first plurality of tasks.

More particularly, in some implementations, the simulation conductor system 240 can determine a set of one or more inputs from the autonomy data logs 154 associated with the corresponding task from the first plurality of tasks that corresponds with the first task from the second plurality of tasks. In some implementations, the set of one or more inputs from the data logs can be modified or amended (e.g., via amendment system 246) to create a different type of data log than might otherwise be available. This could provide an advantage of being able to test operational limits of one or more performance features of an autonomy stack. The original or modified set of one or more inputs from the autonomy data logs 154 can then be provided as the one or more inputs to the first task for execution within the second plurality of tasks.

More particularly, in some implementations, the simulation conductor system 240 can determine one or more sets of one or more inputs or outputs from the autonomy data logs 154 to provide as inputs or outputs to the second plurality of tasks for execution by the simulation computing system 206. In some implementations, the simulation conductor system 240 can support dynamic updating and scheduling of certain inputs and/or outputs from the autonomy data logs 154 in a repeatable manner when certain tasks within the second plurality of tasks have circular dependencies on either inputs/outputs from the autonomy data logs 154 or inputs/outputs from tasks within the second plurality of tasks. Additionally or alternatively, the simulation conductor system 240 can allow sharing of resources from the autonomy data logs 154 for inputs/outputs associated with data that is used across multiple different modules within a vehicle autonomy system or simulation computing system (e.g., map data, sensor data, etc.) The simulation conductor system 240 can advantageously accommodate centralized disk access for reading and/or writing of autonomy data logs 154 to reduce load on network(s) sharing access to the disclosed features.

In some implementations, the simulation characterization system 248 of the simulation conductor system 240 can characterize execution of the second plurality of tasks from the simulated autonomy stack. More particularly, the simulation characterization system 248 can compare a set of one or more outputs of the simulated autonomy stack after implementation of at least the first task from the second plurality of tasks with a corresponding set of one or more outputs from the autonomy data logs 154 corresponding to the output of the operational autonomy stack after implementation of at least the corresponding task from the first plurality of tasks. A simulation characterization can be determined based at least in part on the comparison of the set of one or more outputs of the simulated autonomy stack with the corresponding set of one or more outputs from the autonomy data logs 154. For example, the simulation characterization can include a characterization of the simulation as either successful (e.g., by avoiding occurrence of the event detected during implementation of the first plurality of tasks) or unsuccessful (e.g., by repeating occurrence of the event detected during implementation of the first plurality of tasks). In some implementations, a portion of autonomy software (e.g., at least a portion of the first plurality of tasks from the operational autonomy stack) can be updated based at least in part on the simulation characterization. For instance, if the simulation is characterized as successful, then at least a portion of the first plurality of tasks from the operational autonomy stack can be replaced by at least a portion of the second plurality of tasks from the simulated autonomy stack.

In some implementations, the second plurality of tasks associated with the simulated autonomy stack can be implemented by multiple distinct processing threads within the simulation computing system 206. More particularly, each processing thread can be configured to implement tasks relative to one or more input channels and one or more output channels. In such implementations, the task controller 244 within the simulation conductor system 240 can schedule the second plurality of tasks into a task order and control the flow of inputs to and outputs from the second plurality of tasks for each of the one or more input channels and one or more output channels relative to each of the multiple distinct processing threads.

Figure 3:
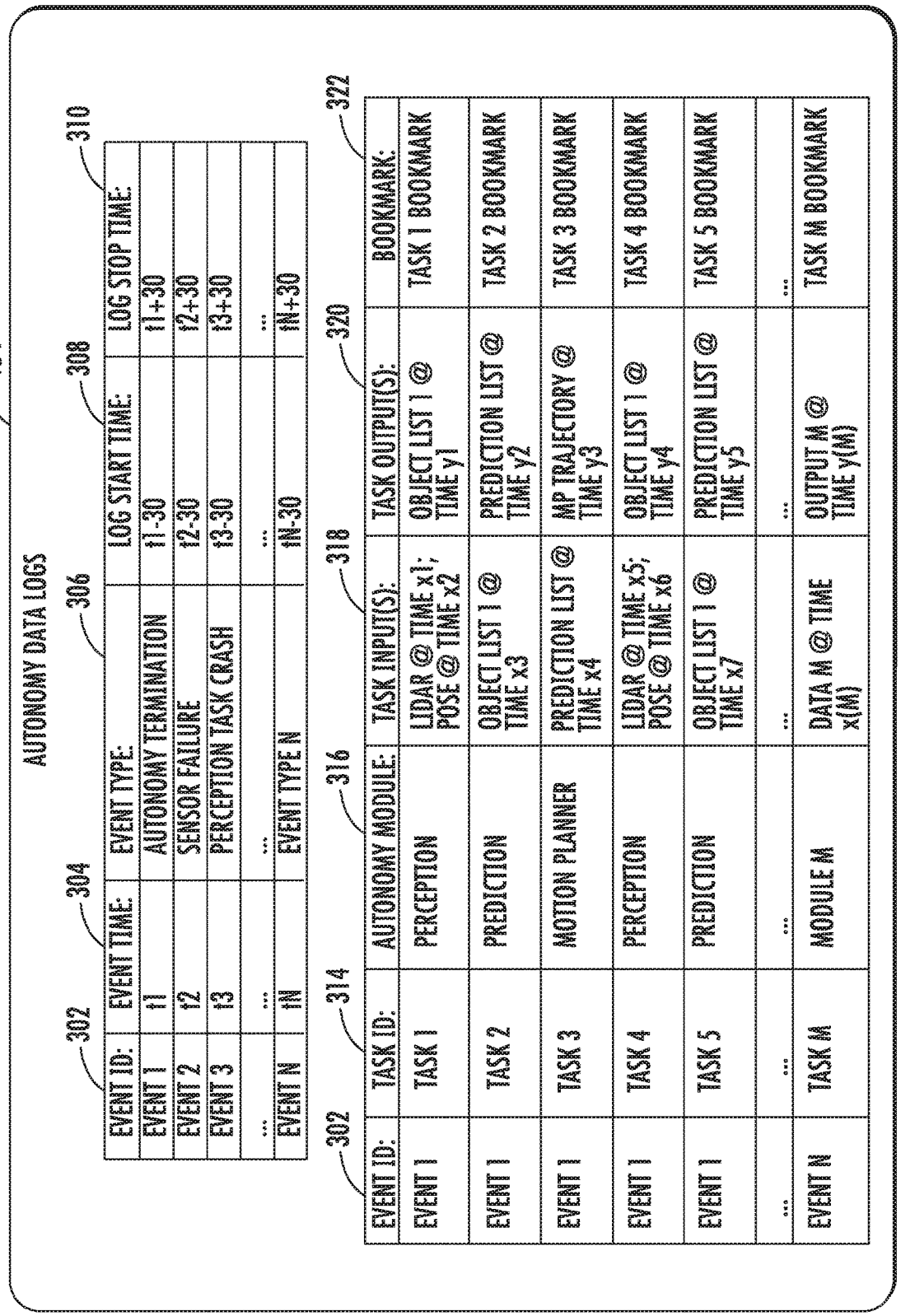
FIG. 3 depicts an example autonomy data log configuration according to example embodiments of the present disclosure.

FIG. 3 depicts an example configuration of a set of autonomy data logs 154 according to example embodiments of the present disclosure. More particularly, example autonomy data logs 154 of FIG. 3 can include data configured in a variety of manners. The example of FIG. 3 depicts autonomy data logs in table format, although other data storage organization options are within the scope of the disclosed technology.

More particularly, in the example of FIG. 3, example autonomy data logs 154 include data associated with a plurality of events (e.g., events detected by event controller 144 of FIG. 1). For each detected event, autonomy data logs can include one or more pieces of data descriptive of the event, such as an event identifier 302, an event time 304, and/or an event type 306. In some implementations, event type 306 can be determined by an event controller (e.g., event controller 144 of FIG. 1) and can be associated with a module of the one or more modules of the operational autonomy stack. For example, if an event happened because a task crashed within the perception module of the operational autonomy stack, then the event type can be associated with the perception system, as identified in the example "Event 3" of FIG. 3.

Task data for each detected event can then be captured during a predetermined window of time defined by a log start time 308 and log stop time 310. In a first example, a first event can be described by event identifier 302 as "Event 1," by event time 304 as having occurred at a time t1, and by event type 306 as corresponding to "Autonomy Termination" (e.g., an event during which the autonomy stack was either manually disengaged by a vehicle operator or automatically disengaged by the vehicle autonomy system). Upon detection of this event, the autonomy data logs 154 are configured to capture task data associated with the first event from a rolling buffer (e.g., first memory 142 of FIG. 1) to the autonomy data logs 154. In the example of FIG. 3, task data between a log start time 308 of 30 seconds before the event time t1 and a log stop time 310 of 30 seconds after the event time t1 is stored in the autonomy data logs 154.

Referring still to FIG. 3, the task data stored for each detected event identified in the autonomy data logs can include, for example, a task identifier 314, an autonomy module 316 associated with the task, one or more task inputs 318 corresponding to each task, one or more task outputs 320 corresponding to each task, and one or more bookmarks 322 associated with each task. For example, autonomy data logs 154 can include a plurality of sets of one or more task inputs 318 and one or more task outputs 320 for each of a respective first plurality of tasks (e.g., Task 1, Task 2, Task 3, Task 4, Task 5, . . . , Task M) associated with a detected event (e.g., Event 1) within an autonomy stack. The autonomy data logs 154 can further include bookmarks 322 for the respective first plurality of tasks (e.g., Task 1, Task 2, Task 3, Task 4, Task 5, . . . , Task M) descriptive of a task ordering within that portion of the autonomy stack.

Figure 4:
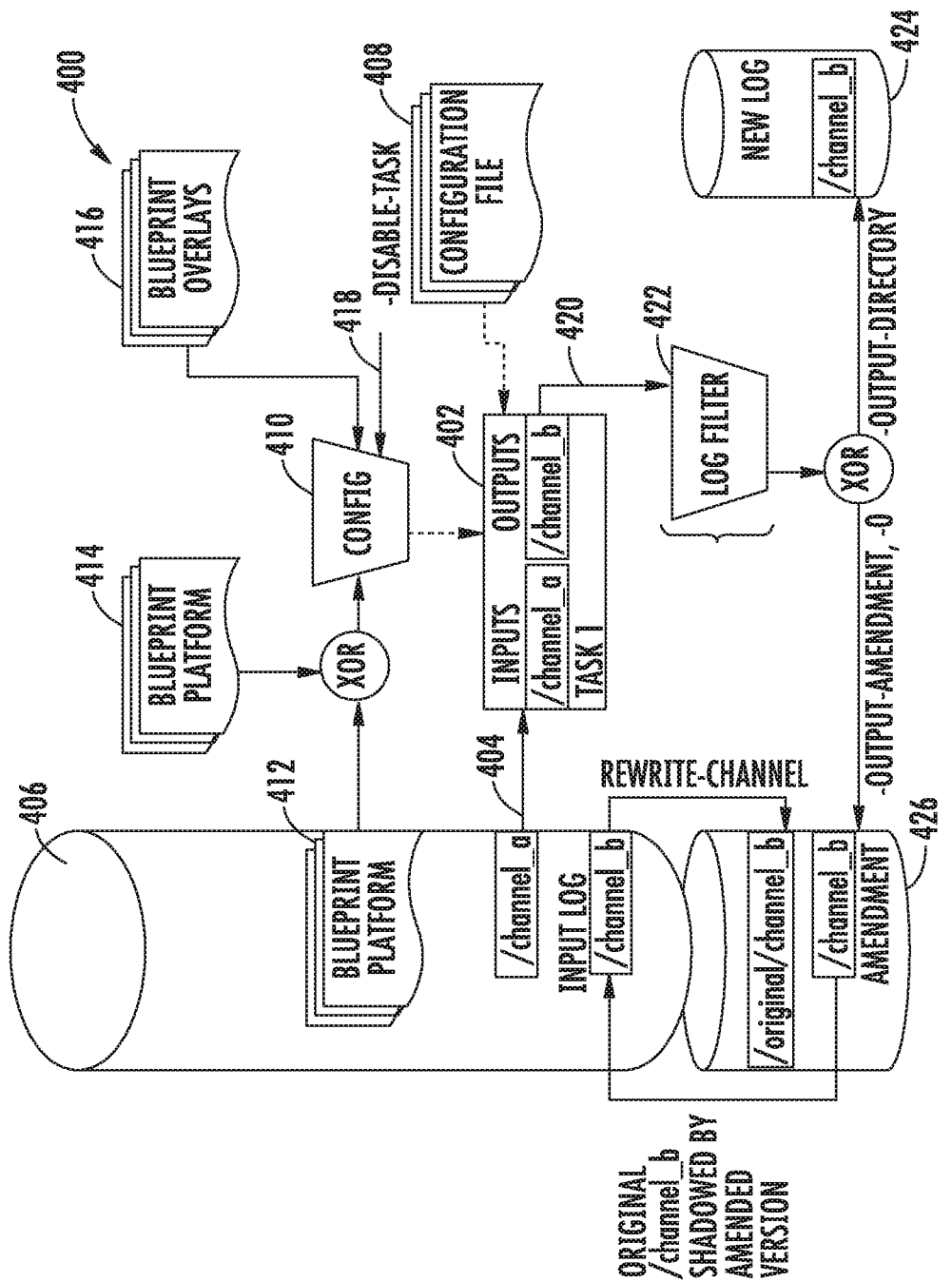
FIG. 4 depicts an example simulation conductor data flow according to example embodiments of the present disclosure.

FIG. 4 depicts an example simulation conductor data flow 400 according to example embodiments of the present disclosure. Simulation conductor data flow 400 illustrates, for example, aspects of the simulation conductor system 240 of FIG. 2 (e.g., task controller 244 and amendment system 246) as the simulation conductor system 240 interacts with simulation computing system 206. More particularly, simulation conductor data flow 400 depicts how one task (e.g., Task 1) within a second plurality of tasks associated with a simulated autonomy stack can be implemented by at least a portion of one or more simulation computing devices (e.g., computing device(s) 229 of simulation computing system 206 of FIG. 2).

In FIG. 4, Task 1 is implemented via a processing thread 402 of a simulation computing system (e.g., simulation computing system 206) configured to receive one or more task inputs 404 via an input channel (e.g., "/channel_a"). Task inputs 404 provided via the input channel can be provided from an Input Log 406. Input log 406 can include, for example, the plurality of inputs associated with each task stored in autonomy data logs 154. Referring back to the example of FIG. 3, Input Log 406 of FIG. 4 can include at least the plurality of task inputs 318 and/or task outputs 320. For execution of Task 1 as depicted in FIG. 4, the task inputs 404 provided from Input Log 406 to processing thread 402 would include LIDAR at time x1 and Pose at time x2.

An identification of Task 1 in a second plurality of tasks can be defined at least in part by a task configuration file 408 provided as an input to processing thread 402. A flow of task inputs 404 to processing thread 402 for the execution of Task 1 can be controlled in accordance with a task processing configuration 410. In some implementations, the task processing configuration 410 is defined by an original configuration file 412, which can include at least the bookmarks included within autonomy data logs. In some implementations, the task processing configuration 410 can be defined by a replacement configuration file 414 which can be substituted as a replacement for original configuration file 412. In some implementations, the task processing configuration 410 can be defined by an overlay configuration file 416 which can be merged with original configuration file 412. The option of an overlay configuration file 416 can be useful when it is desirable to change a small subset of configuration values but would otherwise like to use whatever configuration was used in the autonomy data logs. In some implementations, specific tasks within an original task processing configuration 412 can be disabled via a "disable task" command 418.

Referring still to FIG. 4, after processing thread 402 is controlled to implement Task 1, one or more task outputs 420 can be received via one or more output channels (e.g., "/channel_b"). The one or more task outputs 420 can be provided to a log filter 422, which can define which task outputs for one or more channels should be included and/or excluded in corresponding data logs that store the output tasks. In some implementations, task outputs 420 can be relayed through log filter 422 and stored in a new data log 424 of output tasks. In some implementations, task outputs 420 can be relayed through log filter 422 to an amendment log 426 that includes original task outputs 420 shadowed by an amended version of the task outputs. Comparison of the differences in task outputs can help lead to simulation characterizations (e.g., as implemented via simulation characterization system 248).

Figure 5:
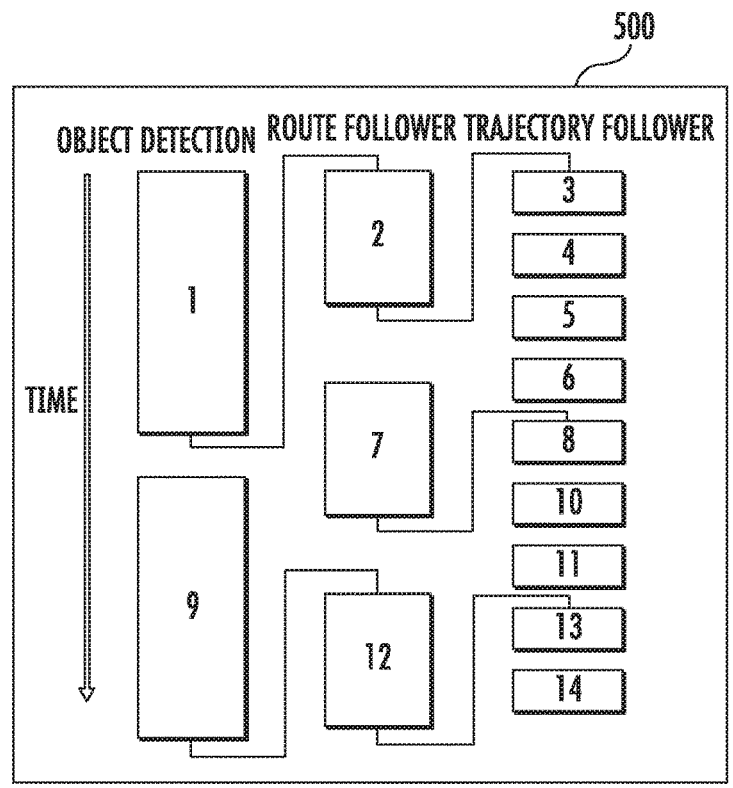
FIG. 5 depicts a first example task flow according to example embodiments of the present disclosure.

FIG. 5 depicts a first example task flow 500 according to example embodiments of the present disclosure. In FIG. 5, first example task flow 500 corresponds with a simulated execution of multiple instances of three different autonomy tasks, namely an Object Detection task, a Route Follower task, and a Trajectory Follower task. Execution of the different autonomy tasks are intended to be running at different rates and different actual processing times to illustrate timing requirements in an autonomy stack. Each box in FIG. 5 is an executive cycle of the task, with the length of the box representing the estimated processing time of the executive and the arrows between the boxes indicating the message passed between the tasks. The numbering (e.g., 1-14) of the different task instances in FIG. 5 is intended to depict the sequential execution ordering of such tasks in real-world implementation of an autonomy stack by a vehicle autonomy system. If all the tasks depicted in FIG. 5 are run in a single thread such that outputs from the tasks are available immediately, first example task flow 500 would result in unrealistic behavior of an autonomy stack since the tasks do not run instantaneously in the real world. In the example of FIG. 5 without determined latencies, the downstream tasks get the information much earlier than they would in reality.

Figure 6:
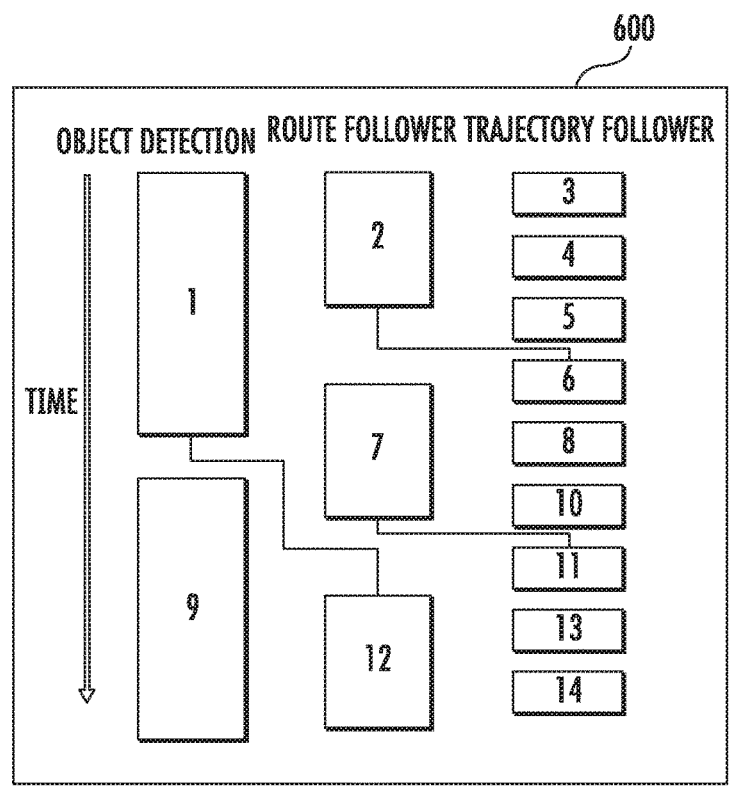
FIG. 6 depicts a second example task flow according to example embodiments of the present disclosure.

FIG. 6 depicts a second example task flow 600 according to example embodiments of the present disclosure. Second example task flow 600 corresponds with a simulated execution of multiple instances of the same three different autonomy tasks depicted in FIG. 5. However, latencies are determined such that outputs from the tasks can be made available to the other tasks at realistic times. As such, an input timing associated with each task from the plurality of tasks depicted in FIG. 6 can be determined relative to a first input timing (e.g., timing stored in bookmarks via an autonomy data log) such that input timings in the simulated task execution of FIG. 6 include determined latencies associated with task execution in an operational autonomy stack. In some implementations, the determined latencies are based in part on expected task execution times, such as would be included within autonomy data log bookmarks. FIG. 6 provides a flowchart diagram of a method 600 to control a sensor system of an autonomous vehicle according to example aspects of the present disclosure. One or more portion(s) of the method 600 can be implemented by one or more computing systems or devices such as, for example, vehicle autonomy system 106 of FIG. 1.

Figure 7:
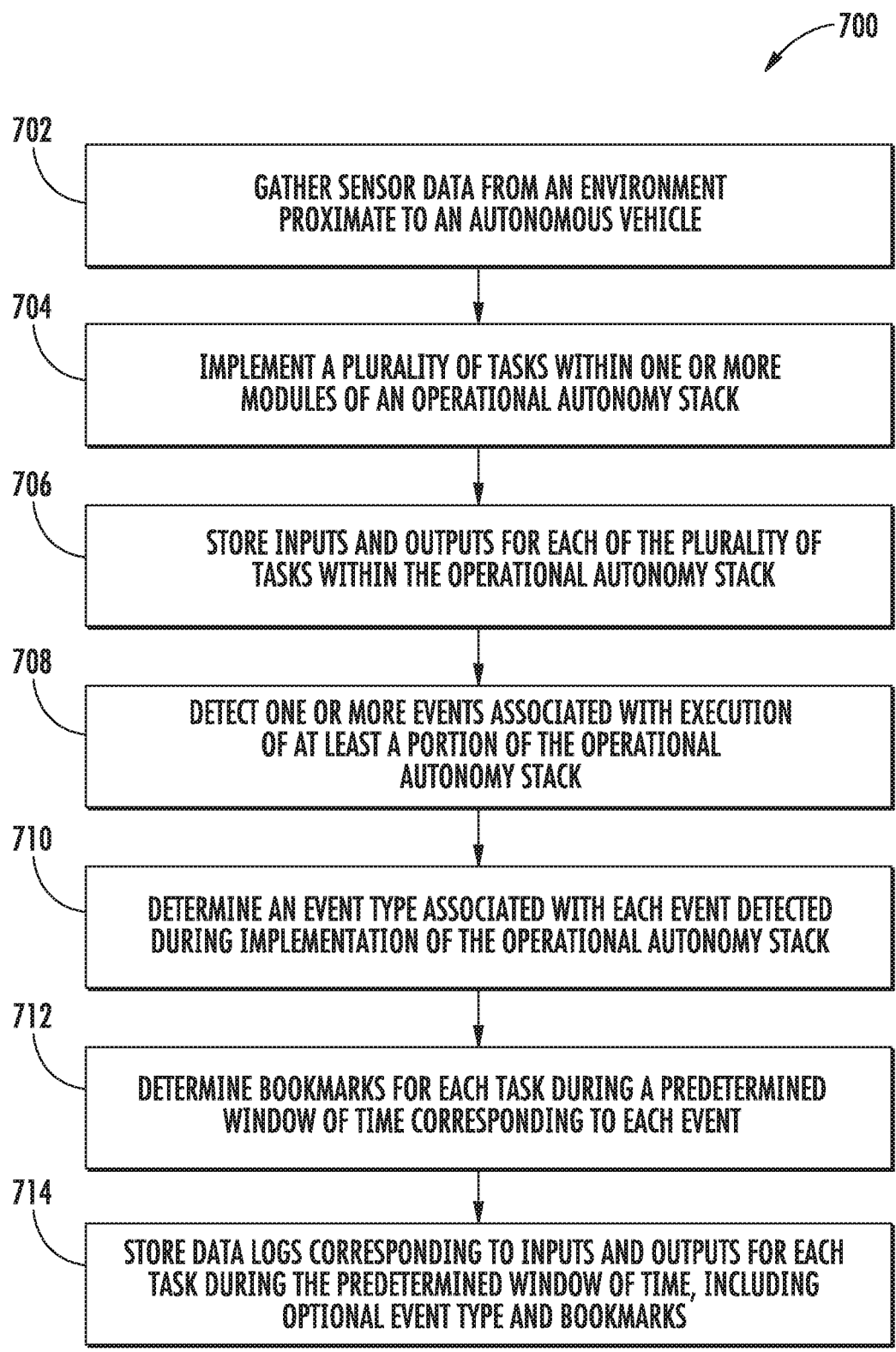
FIG. 7 depicts a flow diagram of an example method for generating autonomy data logs according to example embodiments of the present disclosure.

FIG. 7 provides a flowchart diagram of a method 700 for generating autonomy data logs according to example aspects of the present disclosure. One or more portion(s) of the method 700 can be implemented by one or more computing systems or devices such as, for example, vehicle autonomy system 106 and/or autonomy bookkeeper system 140 of FIG. 1.

At 702, one or more computing devices within a computing system can gather sensor data from an environment surrounding or proximate to an autonomous vehicle. For example, gathering sensor data at 702 can correspond to gathering sensor data from sensor system 102 of FIG. 1 that detects objects proximate to an autonomous vehicle 100 as the vehicle is controlled to navigate relative to such detected objects.

At 704, one or more computing devices within a computing system can implement a plurality of tasks within one or more modules of an operational autonomy stack. For example, the operational autonomy stack can implement a first plurality of tasks within the perception system 110, prediction system 112, motion planning system 114 and/or vehicle controller 116 of a vehicle autonomy system 106 as depicted in FIG. 1.

At 706, one or more computing devices within a computing system can store inputs and outputs for each of the plurality of tasks within the operational autonomy stack. In some implementations, storing inputs and outputs for each of the plurality of tasks within the operational autonomy stack at 706 can include storing such inputs and outputs within a rolling buffer such as embodied by first memory 142 of FIG. 1.

At 708, one or more computing devices within a computing system can detect one or more events associated with execution of at least a portion of the operational autonomy stack. At 710, one or more computing devices within a computing system can determine an event type associated with each event detected at 708 during implementation of the operational autonomy stack. Events detected at 708 can include, but are not limited to, events associated with failed implementation of at least a portion of the operational autonomy stack, events in which the operational autonomy stack is manually disengaged by a vehicle operator, events in which the operational autonomy stack is automatically disengaged by the vehicle autonomy system, and events in which a vehicle fault occurs (e.g., a sensor fails, a task crashes, etc.). In some implementations, detecting one or more events at 708 and/or determining an event type at 710 can be implemented by event controller 144 as depicted in FIG. 1.

At 712, one or more computing devices within a computing system can determine one or more bookmarks for each task during a predetermined window of time corresponding to each event. In some implementations, determining one or more bookmarks at 712 can be implemented by bookmark system 146 as depicted in FIG. 1.

At 714, one or more computing devices within a computing system can store data logs corresponding to inputs and outputs for each task during the predetermined window of time, optionally including the event type determined at 710 and including the bookmark(s) determined at 712. In some implementations, data logs stored at 714 can correspond to autonomy data logs 154 stored within a second memory 152 as depicted in FIG. 1.

Figure 8:
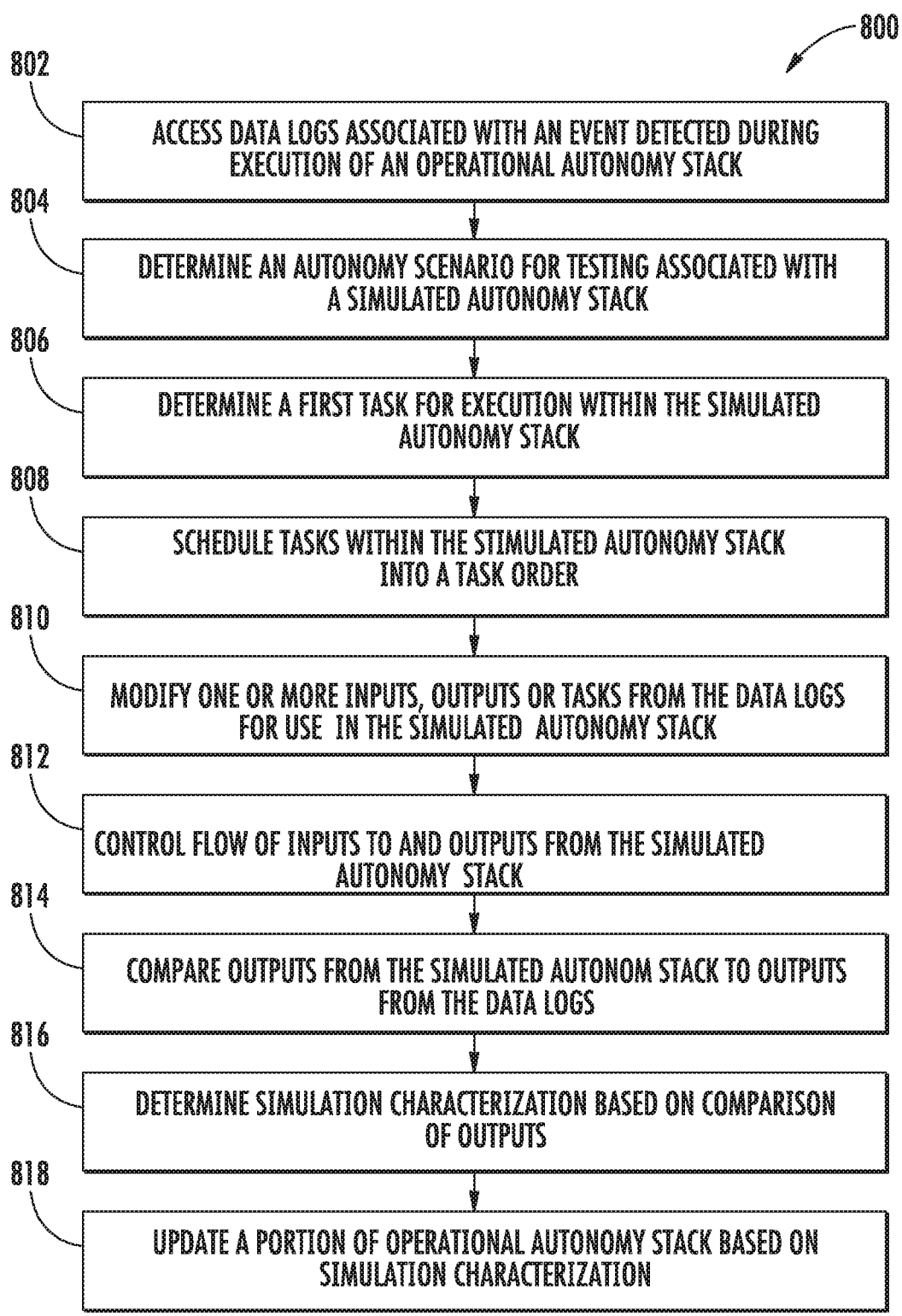
FIG. 8 depicts a flow diagram of an example method for simulated autonomy testing according to example embodiments of the present disclosure.

FIG. 8 provides a flowchart diagram of a method 800 for simulated autonomy testing according to example embodiments of the present disclosure. One or more portion(s) of the method 800 can be implemented by one or more computing systems or devices such as, for example, simulation computing system 206 and/or simulation conductor system 240 of FIG. 2.

At 802, one or more computing devices within a computing system can access data logs associated with an event detected during execution of an operational autonomy stack. The data logs accessed at 802 can correspond, for example, to the data logs stored at 714 in FIG. 7. Such stored data logs can include, for example, data associated with a first plurality of tasks associated with an operational autonomy stack that had been previously implemented online during operation of an autonomous vehicle. In some implementations, the data logs accessed at 802 can be associated with an event detected in response to a failed implementation of at least a portion of the operational autonomy stack. The data logs accessed at 802 can thus sometimes include an indication of an event type associated with the event.

At 804, one or more computing devices within a computing system can determine an autonomy scenario for testing associated with a simulated autonomy stack. In some implementations, the simulated autonomy stack can include a second plurality of tasks. In some implementations, the second plurality of tasks within the simulated autonomy stack can correspond to at least a subset of a first plurality of tasks implemented in an operational autonomy stack (e.g., the first plurality of tasks implemented at 704). In some implementations, when the data logs accessed at 802 include an indication of an event type associated with an event that triggered storage of the data logs, such event type can help determine an autonomy scenario for testing at 804.

At 806, one or more computing devices within a computing system can determine a first task for execution within the simulated autonomy stack (e.g., second plurality of tasks). In some implementations, the first task for execution within the simulated autonomy stack (e.g., second plurality of tasks) can correspond to a task within the first plurality of tasks (e.g., tasks associated with an operational autonomy stack). In some implementations, the first task for execution within the second plurality of tasks is determined at 806 to reduce a total run time of the second plurality of tasks relative to a total run time of the first plurality of tasks.

In some implementations, such as when the data logs accessed at 802 include an identification of an event type that triggered storage of the data logs, such event type can help determine the first task for execution at 806. For example, if an event type identifies an event corresponding to task failure in the prediction system of an operational autonomy stack, then the first task for execution within the second plurality of tasks might correspond to a task within the prediction system of the simulated autonomy stack as opposed to an earlier task (e.g., one within the perception system of the simulated autonomy stack).

At 808, one or more computing devices within a computing system can schedule tasks within the simulated autonomy stack into a task order. In some implementations, scheduling the second plurality of tasks into a task order at 808 can be determined at least in part from the bookmarks stored in the data logs for the first plurality of tasks (e.g., the bookmarks determined at 712 and stored in the data logs at 714 as depicted in FIG. 7);

At 810, one or more computing devices within a computing system can modify one or more inputs, outputs, or tasks from the data logs for use in the simulated autonomy stack. Modifications implemented at 810 can be made, for example, via amendment system 246 of FIG. 2.

At 812, one or more computing devices within a computing system can control a flow of inputs to and outputs from the simulated autonomy stack (e.g., a second plurality of tasks). In some implementations, one or more inputs to the second plurality of tasks correspond to one or more inputs or outputs obtained from the data logs accessed at 802. When the first task for execution as determined at 806 within a simulated autonomy stack (e.g., second plurality of tasks) has a corresponding task that was implemented during an operational autonomy stack (e.g., first plurality of tasks), then controlling a flow of inputs to and outputs from the simulated autonomy stack at 812 can include providing a set of one or more inputs from the data logs accessed at 802 associated with the corresponding task from the first plurality of tasks as the one or more inputs to the first task for execution within the second plurality of tasks as determined at 806.

In some implementations, controlling the flow of inputs to and outputs from the second plurality of tasks based at least in part on the task order at 812 can include determining a latency for each of the one or more inputs to each task such that a second input timing associated with each task from the second plurality of tasks (e.g., tasks associated with the autonomy scenario for testing and associated simulated autonomy stack determined at 804) is determined relative to a first input timing associated with each task from the first plurality of tasks (e.g., tasks associated with an operational autonomy stack as implemented at 704).

In some implementations, one or more computing devices can implement the second plurality of tasks within the simulated autonomy stack. In some implementations, this can include implementing, by multiple distinct processing threads within one or more simulation computing devices, the second plurality of tasks. Each processing thread can be, for example, configured to implement tasks relative to one or more input channels and one or more output channels. In some implementations, implementing the second plurality of tasks comprises scheduling the second plurality of tasks into the task order at 808 and controlling the flow of inputs to and outputs from the second plurality of tasks at 812. When the second plurality of tasks is implemented by multiple distinct processing threads, implementation of the second plurality of tasks can include scheduling tasks into a task order at 808 and controlling flow of inputs to and outputs from the second plurality of tasks at 810 for each of the one or more input channels and one or more output channels relative to each of the multiple distinct processing threads.

At 814, one or more computing devices within a computing system can compare outputs from the simulated autonomy stack to outputs from the data logs. At 816, one or more computing devices within a computing system can determine a simulation characterization based at least in part on the comparison at 814 of the outputs. Comparison of outputs at 814 and determining a simulation characterization at 816 can be implemented, for example, by simulation characterization system 248 of FIG. 2.

At 818, one or more computing devices within a computing system can update a portion of an operational autonomy stack based on the simulation characterization determined at 816. For example, when the simulation characterization determined at 816 includes a characterization of the simulation as either successful (e.g., by avoiding occurrence of an event detected during implementation of the first plurality of tasks such as at 704), then a portion of autonomy software (e.g., at least a portion of the first plurality of tasks from the operational autonomy stack implemented at 704) can be updated (e.g., replaced by at least a portion of the second plurality of tasks from the simulated autonomy stack determined at 806).

Computing tasks discussed herein as being performed at computing device(s) remote from the autonomous vehicle can instead be performed at the autonomous vehicle (e.g., via the vehicle computing system), or vice versa. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implements tasks and/or operations can be performed sequentially or in parallel. Data and instructions can be stored in a single memory device or across multiple memory devices.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A simulation system for autonomous vehicle testing, comprising:
 a memory configured to store data logs comprising a plurality of sets of one or more inputs and one or more outputs for each of a respective first plurality of tasks within an autonomy stack, the data logs further comprising bookmarks for the respective first plurality of tasks descriptive of a task ordering within the autonomy stack;
 one or more simulation computing devices comprising one or more processors and one or more tangible, non-transitory, computer readable media that collectively store instructions that when executed by the one or more processors cause the one or more simulation computing devices to perform operations comprising:
  determining an autonomy scenario for testing, the autonomy scenario for testing comprising a second plurality of tasks;
  scheduling the second plurality of tasks into a task order determined at least in part from the bookmarks stored in the data logs for the first plurality of tasks;
  controlling a flow of inputs to and outputs from the second plurality of tasks based at least in part on the task order and determined latencies for the inputs to one or more tasks of the second plurality of tasks, wherein one or more inputs to the second plurality of tasks correspond to one or more inputs or outputs obtained from the data logs;
  determining a simulation characterization based at least in part on execution of the second plurality of tasks; and
  updating a portion of an operational autonomy stack based at least in part on the simulation characterization.

2. The simulation system for autonomous vehicle testing of claim 1, wherein controlling the flow of inputs to and outputs from the second plurality of tasks based at least in part on the task order and determined latencies for the inputs to one or more tasks of the second plurality of tasks comprises determining a latency for each of the one or more inputs to each task such that a second input timing associated with each task from the second plurality of tasks is determined relative to a first input timing associated with each task from the first plurality of tasks.

3. The simulation system for autonomous vehicle testing of claim 1, wherein the operations performed by the one or more simulation computing devices further comprise:
 implementing, by multiple distinct processing threads within the one or more simulation computing devices, the second plurality of tasks;
 wherein each processing thread is configured to implement tasks relative to one or more input channels and one or more output channels.

4. The simulation system for autonomous vehicle testing of claim 3, wherein implementing, by multiple distinct processing threads within the one or more simulation computing devices, the second plurality of tasks comprises scheduling the second plurality of tasks into the task order and controlling the flow of inputs to and outputs from the second plurality of tasks for each of the one or more input channels and one or more output channels relative to each of the multiple distinct processing threads.

5. The simulation system for autonomous vehicle testing of claim 1, wherein the first plurality of tasks are associated with an operational autonomy stack that had been previously implemented online during operation of an autonomous vehicle.

6. The simulation system for autonomous vehicle testing of claim 5, wherein the data logs are associated with an event detected in response to a failed implementation of at least a portion of the operational autonomy stack, the data logs comprising an indication of an event type associated with the event.

7. The simulation system for autonomous vehicle testing of claim 6, wherein the operations performed by the one or more simulation computing devices further comprise:
 determining a first task for execution within the second plurality of tasks based at least in part on the event type, wherein the first task for execution within the second plurality of tasks corresponds to a task within the first plurality of tasks.

8. The simulation system for autonomous vehicle testing of claim 7, wherein the first task for execution within the second plurality of tasks is determined to reduce a total run time of the second plurality of tasks relative to a total run time of the first plurality of tasks.

9. A computer-implemented method, comprising:
 accessing, by a computing system comprising one or more computing devices, data logs associated with an event that occurred during implementation of an operational autonomy stack within a vehicle autonomy system, wherein the data logs comprise a plurality of sets of one or more inputs and one or more outputs for each of a respective first plurality of tasks within the operational autonomy stack implemented by the vehicle autonomy system, the data logs further comprising bookmarks for the respective first plurality of tasks descriptive of a task ordering within the operational autonomy stack;
 determining, by the computing system, an autonomy scenario for testing, the autonomy, scenario for testing associated with a simulated autonomy stack comprising a second plurality of tasks, wherein the second plurality of tasks is associated with at least a subset of the first plurality of tasks;
 scheduling, by the computing system, the second plurality of tasks into a task order determined at least in part from the bookmarks;
 controlling, by the computing system, a flow of inputs to and outputs from the second plurality of tasks based at least in part on the task order and determined latencies for the inputs to one or more tasks of the second plurality of tasks, wherein one or more inputs to the second plurality of tasks correspond to one or more inputs or outputs obtained from the data logs;
 determining, by the computing system, a simulation characterization based at least in part on execution of the second plurality of tasks; and
 updating, by the computing system, a portion of an operational autonomy stack based at least in part on the simulation characterization.

10. The computer-implemented method of claim 9, further comprising:
 determining, by the computing system, a first task for execution within the second plurality of tasks based at least in part on an event type associated with the event, wherein the first task for execution within the second plurality of tasks corresponds to a corresponding task within the first plurality of tasks.

11. The computer-implemented method of claim 10, wherein the first task for execution within the second plurality of tasks is determined to reduce a total run time of the second plurality of tasks relative to a total run time of the first plurality of tasks.

12. The computer-implemented method of claim 10, further comprising providing, by the computing system, a set of one or more inputs from the data logs associated with the corresponding task from the first plurality of tasks as the one or more inputs to the first task for execution within the second plurality of tasks.

13. The computer-implemented method of claim 12, further comprising modifying, by the computing system; the set of one or more inputs from the data logs associated with the corresponding task from the first plurality of tasks before the providing, by the computing system, the set of one or more inputs from the data logs to the first task for execution within the second plurality of tasks.

14. The computer-implemented method of claim 12, further comprising:
 comparing, by the computing system, a set of one or more outputs of the simulated autonomy stack after implementation of at least the first task from the second plurality of tasks with a corresponding set of one or more outputs from the data logs corresponding to the output of the operational autonomy stack after implementation of at least the corresponding task from the first plurality of tasks; and
 determining, by the computing system, a simulation characterization based at least in part on the comparison of the set of one or more outputs of the simulated autonomy stack with the corresponding set of one or more outputs from the data logs.

15. The computer-implemented method of claim 14, further comprising updating, by the computing system, a portion of the operational autonomy stack based at least in part on the simulation characterization.

16. The computer-implemented method of claim 10, wherein the second plurality of tasks within the simulated autonomy stack comprises at least one modification relative to the first plurality of tasks within the operational autonomy stack to test effects of the at least one modification relative to the event.

17. An autonomous vehicle, comprising:
 a sensor system configured to gather sensor data indicative of a surrounding environment of an autonomous vehicle;
 a vehicle autonomy system comprising one or more computing devices configured to implement a plurality of tasks within one or more modules of an operational autonomy stack to detect objects of interest within the sensor data and determine a motion plan for the autonomous vehicle relative to the objects of interest;
 a first memory configured to store inputs and outputs for each of the plurality of tasks within the operational autonomy stack;
 an event controller configured to detect one or more events associated with execution of at least a portion of the operational autonomy stack;
 a second memory configured to store data logs corresponding to the inputs and outputs for each task during a predetermined window of time corresponding to each event; and
 a bookmark system configured to determine bookmarks for each task during the predetermined window of time corresponding to each event, the bookmarks descriptive of a task ordering and timing associated with the inputs and outputs for each of the plurality of tasks within the operational autonomy stack, wherein the second memory is further configured to store the bookmarks in the data logs;
 wherein the event controller is configured to transfer the inputs and outputs and the timing for each task during the predetermined window of time corresponding to each event from the first memory to the second memory upon detection of each event.

18. The autonomous vehicle of claim 17, wherein the event controller is further configured to determine an event type associated with each event detected during implementation of the operational autonomy stack, the event type associated with a module of the one or more modules of the operational autonomy stack, and wherein the second memory is further configured to store the event type in the data logs.

19. The autonomous vehicle of claim 17, wherein the predetermined window of time comprises a log start time and a log stop time respectively defined relative to an event time associated with each event.

* * * * *